(12) United States Patent
Kotani

(10) Patent No.: US 8,421,187 B2
(45) Date of Patent: Apr. 16, 2013

(54) SEMICONDUCTOR DEVICE AND MANUFACTURING METHOD THEREOF

(75) Inventor: Syouichi Kotani, Tama (JP)

(73) Assignee: Teramikros, Inc., Tokyo (JP)

( * ) Notice: Subject to any disclaimer, the term of this patent is extended or adjusted under 35 U.S.C. 154(b) by 192 days.

(21) Appl. No.: 12/848,355

(22) Filed: Aug. 2, 2010

(65) Prior Publication Data
US 2011/0031584 A1 Feb. 10, 2011

(30) Foreign Application Priority Data

Aug. 6, 2009 (JP) ................. 2009-183160

(51) Int. Cl.
*H01L 27/08* (2006.01)
*H01L 23/52* (2006.01)
*H01L 21/82* (2006.01)

(52) U.S. Cl.
USPC ............... 257/531; 257/773; 257/E29.325; 438/128

(58) Field of Classification Search ............ 257/531, 257/773, E29.325, E23.01, E21.022; 438/666, 438/391, 128
See application file for complete search history.

(56) References Cited

U.S. PATENT DOCUMENTS

| 6,316,735 | B1 * | 11/2001 | Higashiguchi | 174/260 |
| 2009/0085894 | A1 * | 4/2009 | Gandhi et al. | 345/175 |

FOREIGN PATENT DOCUMENTS

| JP | 10-270812 A | 10/1998 |
| JP | 2008-244383 A | 10/2008 |
| JP | 2009-049306 A | 3/2009 |

OTHER PUBLICATIONS

English translation of JP 2008-244382, Oct. 10, 2008.*
Japanese Office Action dated Nov. 2, 2012 issued in counterpart Japanese Application No. 2009-183160.

* cited by examiner

*Primary Examiner* — Thomas L Dickey
*Assistant Examiner* — Nikolay Yushin
(74) *Attorney, Agent, or Firm* — Holtz, Holtz, Goodman & Chick PC

(57) ABSTRACT

A first insulating film includes five extension lines formed between connection pad portions of adjacent two predetermined wiring lines. The first insulating film also includes peripheral portions of the adjacent two connection pad portions on both sides of the five extension lines. A second insulating film made of a polyimide resin or the like is formed on the upper surface of the first insulating layer by a screen printing method or ink jet method. Since a short circuit may be easily caused by electromigration in a region where the five extension lines are parallel to another, the short circuit due to the electromigration can be prevented by covering only that region with the second insulating film. Accordingly, the region where the second insulating film is formed can be as small as possible, and the semiconductor wafer does not easily warp.

11 Claims, 18 Drawing Sheets

SEMICONDUCTOR DEVICE AND MANUFACTURING METHOD THEREOF

CROSS-REFERENCE TO RELATED APPLICATIONS

This application is based upon and claims the benefit of priority from prior Japanese Patent Application. No. 2009-183160, filed Aug. 6, 2009, the entire contents of which are Incorporated herein by reference.

BACKGROUND OF THE INVENTION

1. Field of the Invention

This invention relates to a semiconductor device having a low dielectric constant film and a manufacturing method thereof.

2. Description of the Related Art

A so-called chip size package (CSP) is known from Jpn. Pat. Appln. KOKAI Publication No. 2008-244383. This semiconductor device comprises a semiconductor substrate. A first insulating film is provided on the upper surface of the semiconductor substrate. A plurality of wiring lines are provided on the upper surface of the first insulating film. A columnar electrode is provided on the upper surface of a connection pad portion of the wiring line. A second insulating film is provided on the surface of the wiring line, the outer peripheral surface of the columnar electrode and the upper surface of the first insulating film. A sealing film is provided on the upper surface of the second insulating film around the second insulating film provided on the outer peripheral surface of the columnar electrode. A solder ball is provided on the upper surface of the columnar electrode.

In this case, the second insulating film is made of, for example, a polyimide resin. The polyimide resin is a material lower in water absorption coefficient than an epoxy resin which is a material of the sealing film. The use of such a material is intended to prevent a short circuit from being easily caused by electromigration across the wiring lines. Specifically, when no second insulating film is formed, the wiring lines are directly covered with the sealing film made of the epoxy resin. Therefore, a metal (copper) in the wiring lines may ionize and melt due to the electromigration. The melted ions may diffuse into the sealing film, and a short circuit may occur between the wiring lines.

Thus, the wiring lines are covered with the second insulating film made of the polyimide resin lower in water absorption coefficient than the epoxy resin which is the material of the sealing film. As a result, the electromigration does not occur easily. This makes it possible to prevent a short circuit from being easily caused by the electromigration across the wiring lines.

In the meantime, according to the above-mentioned conventional semiconductor device manufacturing method, the second insulating film made of the polyimide resin is formed by, for example, a spin coat method all over the surface of the wiring line, the outer peripheral surface of the columnar electrode and the upper surface of the first insulating film on the semiconductor substrate in a wafer state (hereinafter referred to as a semiconductor wafer). Therefore, the semiconductor wafer contracts due to the curing of the second insulating film, and relatively greatly warps accordingly. The warping of the semiconductor wafer may be disadvantageous to the subsequent steps.

BRIEF SUMMARY OF THE INVENTION

It is therefore an object of this invention to provide a semiconductor device manufacturing method which can prevent the entirety including semiconductor substrates from being easily warped even if a first insulating film and a second insulating film were formed.

According to a first embodiment of the invention, there is provided a semiconductor device comprising:

a first insulating film;

a plurality of wiring lines provided on the first insulating film, each of the wiring lines including a connection pad portion and an extension line; and a second insulating film provided on part of the first insulating film including the wiring lines, wherein at least a part in which the distance between the extension lines arranged between the adjacent connection pad portions is the smallest is covered with the second insulating film.

According to the other embodiment of the invention, there is provided a semiconductor device manufacturing method comprising:

forming extension lines of a plurality of wiring lines to extend parallel to one another between adjacent outermost connection pad portions, the wiring lines including the connection pad portions arranged on a first insulating film; and forming a second insulating film over the extension lines in at least a part in which the distance between the extension lines arranged between the adjacent connection pad portions is the smallest.

According to the other embodiment of the invention, there is provided a semiconductor device manufacturing method comprising:

forming a lower wiring line on a first insulating film;

forming a second insulating film on part of the first insulating film including the entire lower wiring line; and forming a wiring line on the first insulating film including the second insulating film.

According to the invention, the second insulating film is formed on one part of the first insulating film. As a result, the region where the second insulating film is formed can be minimized. Consequently, even if the second insulating film cures and contracts, the semiconductor wafer is not easily warped.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION (First Embodiment)

Figure 1:
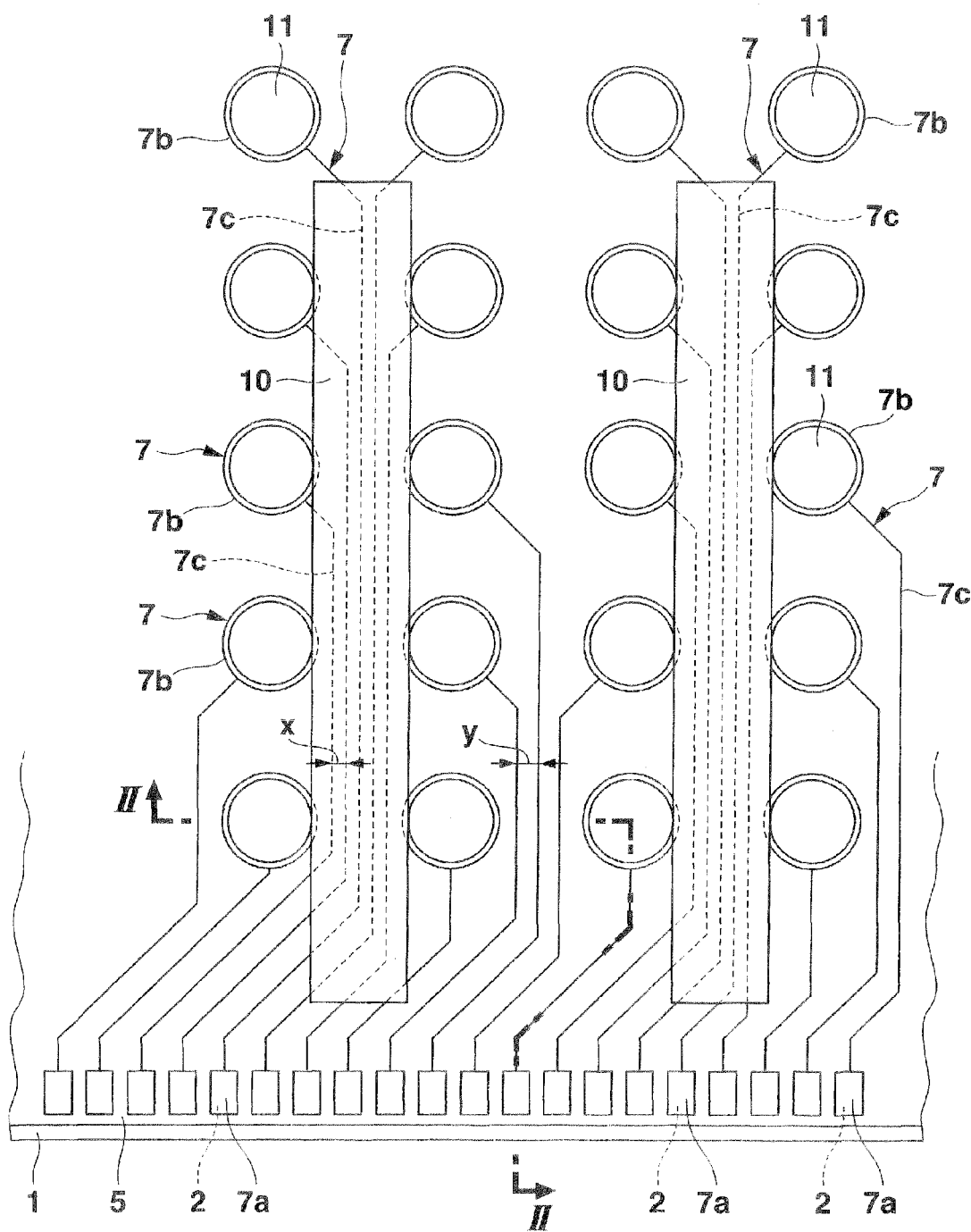
FIG. 1 is a plan view of essential parts of a semiconductor device according to a first embodiment of the present invention.
Figure 2:
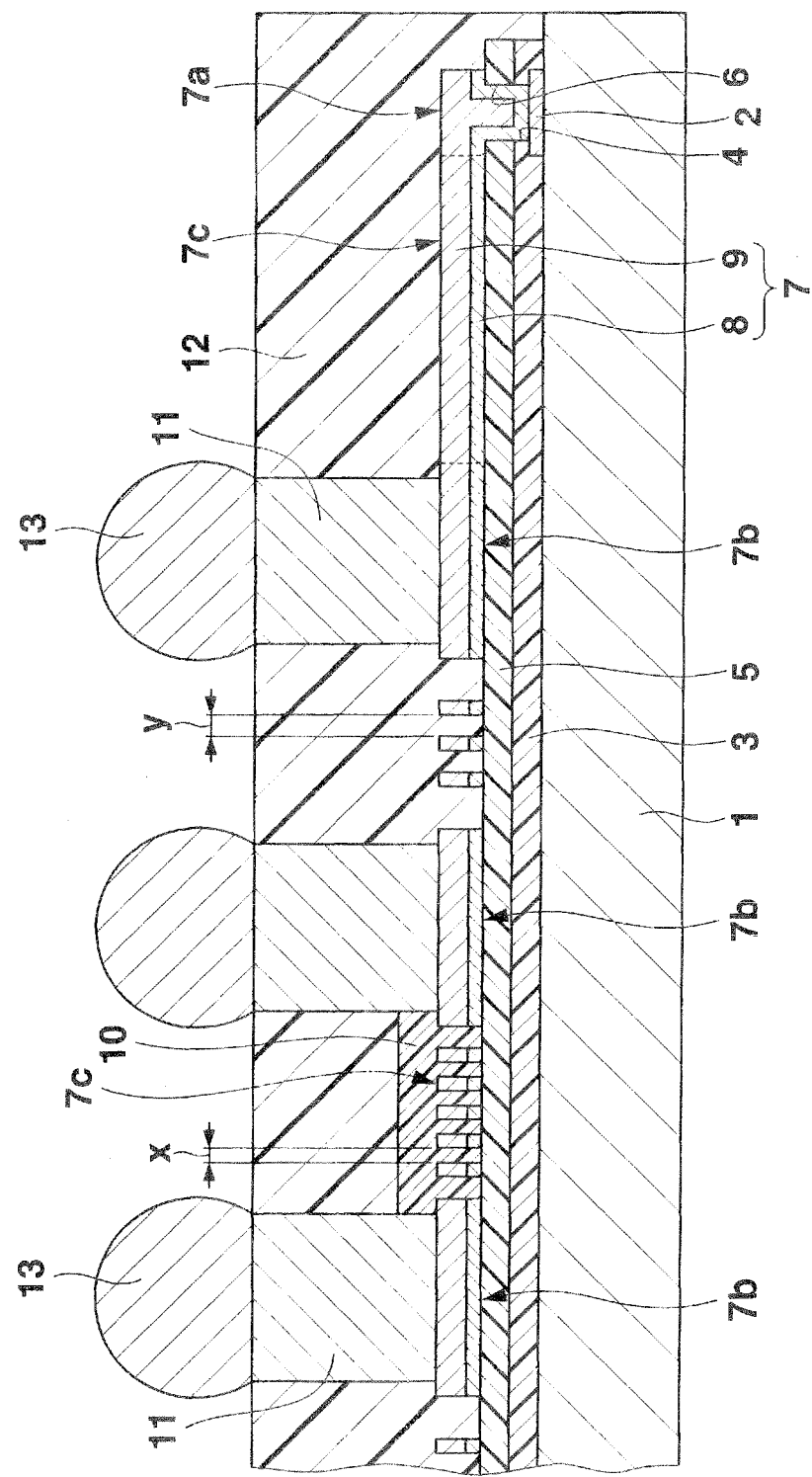
FIG. 2 is a sectional view of a portion substantially along the line II-II line of FIG. 1.

FIG. 1 shows a plan view of essential parts of a semiconductor device according to a first embodiment of the present invention. FIG. 2 shows a sectional view of a portion substantially along the line II-II line of FIG. 1. In this case, a sealing film 12 and a solder ball 13 that are shown in FIG. 2 are omitted in the plan view of FIG. 1. This semiconductor device is generally called a CSP, and comprises a silicon substrate (semiconductor substrate) 1 having a square planar shape. Elements (not shown) such as a transistor, diode, resistor and condenser that constitute an integrated circuit having a predetermined function are formed on the upper surface of the silicon substrate 1. A plurality of connection pads 2 are provided on the peripheral portion of the upper surface of the silicon substrate 1. The connection pads 2 are made of, for example, an aluminum-based metal, and connected to the elements of the integrated circuit.

A passivation film 3 made of, for example, silicon oxide is provided on the upper surface of the silicon substrate 1 except for the peripheral portion of the silicon substrate 1 and the centers of the connection pads 2. The centers of the connection pads 2 are exposed through openings 4 provided in the passivation film 3. A first protective film (first insulating film) 5 made of, for example, a polyimide resin is provided on the upper surface of the passivation film 3. Openings 6 are provided in parts of the first insulating film 5 that correspond to the openings 4 of the passivation film 3.

A plurality of wiring lines 7 are provided on the upper surface of the first insulating film 5. The wiring line 7 has a double-layer structure composed of a foundation metal layer 8 and an upper metal layer 9. The foundation metal layer 8 is made of, for example, copper and provided on the upper surface of the first insulating film 5. The upper metal layer 9 is made of copper and provided on the upper surface of the foundation metal layer 8. One end of the wiring line 7 is connected to the connection pad 2 via the openings 4, 6 of the passivation film 3 and the first insulating film 5.

Here, the wiring line 7 includes an end 7a connected to the connection pad 2, a connection pad portion 7b which has a circular planar shape and which serves as a seat for a later-described columnar electrode 11, and an extension line 7c extending therebetween. The connection pad portions 7b of the wiring lines 7 are arranged in matrix form on the upper surface of the first insulating film 5. Thus, the extension lines 7c of the wiring lines 7 having the connection pad portions 7b that are disposed on an inner side (upper side in FIG. 1) extend between the connection pad portions 7b of two adjacent wiring lines 7 that are disposed on an outer side (lower side in FIG. 1).

In particular, a greatest possible number of extension lines 7c, for example, five extension lines 7c extend between two adjacent outermost connection pad portions 7b and between two adjacent second outermost connection pad portions 7b. The five extension lines 7c are partly arranged parallel to one another, and are connected to the third outermost, fourth outermost and fifth outermost connection pad portions 7b, respectively.

Furthermore, in the region where the five extension lines 7c are parallel to one another, the distance between the extension lines 7c is the smallest. As a result, a short circuit is apt to be caused by electromigration across the extension lines 7c in such a region. Thus, in this semiconductor device, a second insulating film 10 is provided, linearly in the shape of a belt when viewed from above, on the upper surface of the first insulating film 5 in a part where the five extension lines 7c are parallel to one another and both sides of this part including the peripheral portions of the adjacent two connection pad portions 7b. That is, at least a part in which the distance between the extension lines (7c) arranged between the adjacent connection pad portions (7b) is the smallest is covered with the second insulating film (10). A distance x perpendicular to an extending direction is smaller than a distance y. In this case, the second insulating film 10 is made of, for example, a polyimide resin lower in water absorption coefficient than an epoxy resin which is the material of the later-described sealing film 12.

This makes it possible to prevent a short circuit from being easily caused by the electromigration in the part where the five extension lines 7c are parallel to one another, including a part where two of these extension lines 7c are parallel to each other. When there are two or more parts where the five extension lines 7c are parallel to one another, the second insulating film 10 is disposed at two or more places accordingly. The belt-shaped linear second insulating film 10 may be only provided in the part where the five extension lines 7c are parallel to one another and its vicinity on the upper surface of the first insulating film 5.

The columnar electrode 11 made of copper and having a circular planar shape is provided on the upper surface of the connection pad portion 7b of the wiring line 7. The sealing film 12 made of an epoxy resin is provided around the columnar electrode 11 on the upper surface of the peripheral portion of the silicon substrate 1, on the upper surface of the first insulating film 5 including the wiring line 7, and on the upper surface of the second insulating film 10. Here, the columnar electrode 11 is provided so that the upper surface thereof is flush with or several μm lower than the upper surface of the sealing film 12. The solder ball 13 is provided on the upper surface of the columnar electrode 11.

Figure 3:
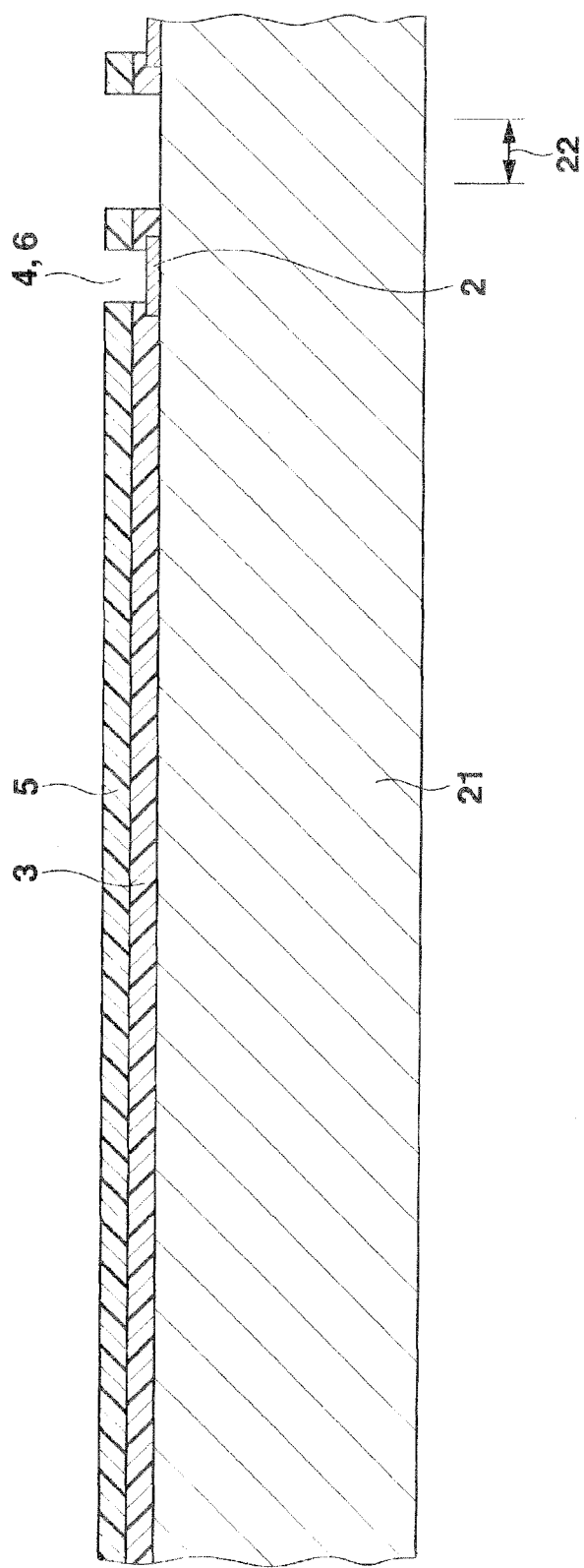
FIG. 3 is a sectional view of an initially prepared assembly in one example of a method of manufacturing the semiconductor device shown in FIG. 1 and FIG. 2.

Now, one example of a method of manufacturing this semiconductor device is described. First, as shown in FIG. 3, an assembly is prepared. In this assembly, a plurality of connection pads 2 made of, for example, an aluminum-based metal, a passivation film 3 made of, for example, silicon oxide, and a first insulating film 5 made of, for example, a polyimide resin are formed on the upper surface of a silicon substrate in a wafer state (hereinafter referred to as a semiconductor wafer 21). The centers of the connection pads 2 are exposed through openings 4, 6 of the passivation film 3 and the first insulating film 5.

In this case, the thickness of the semiconductor wafer 21 is greater than the thickness of a silicon substrate 1 shown in FIG. 2. In FIG. 3, zones indicated by the sign 22 are dicing streets. The parts of the passivation film 3 and the first insulating film 5 corresponding to the dicing street 22 and both its sides are removed.

Figure 4:
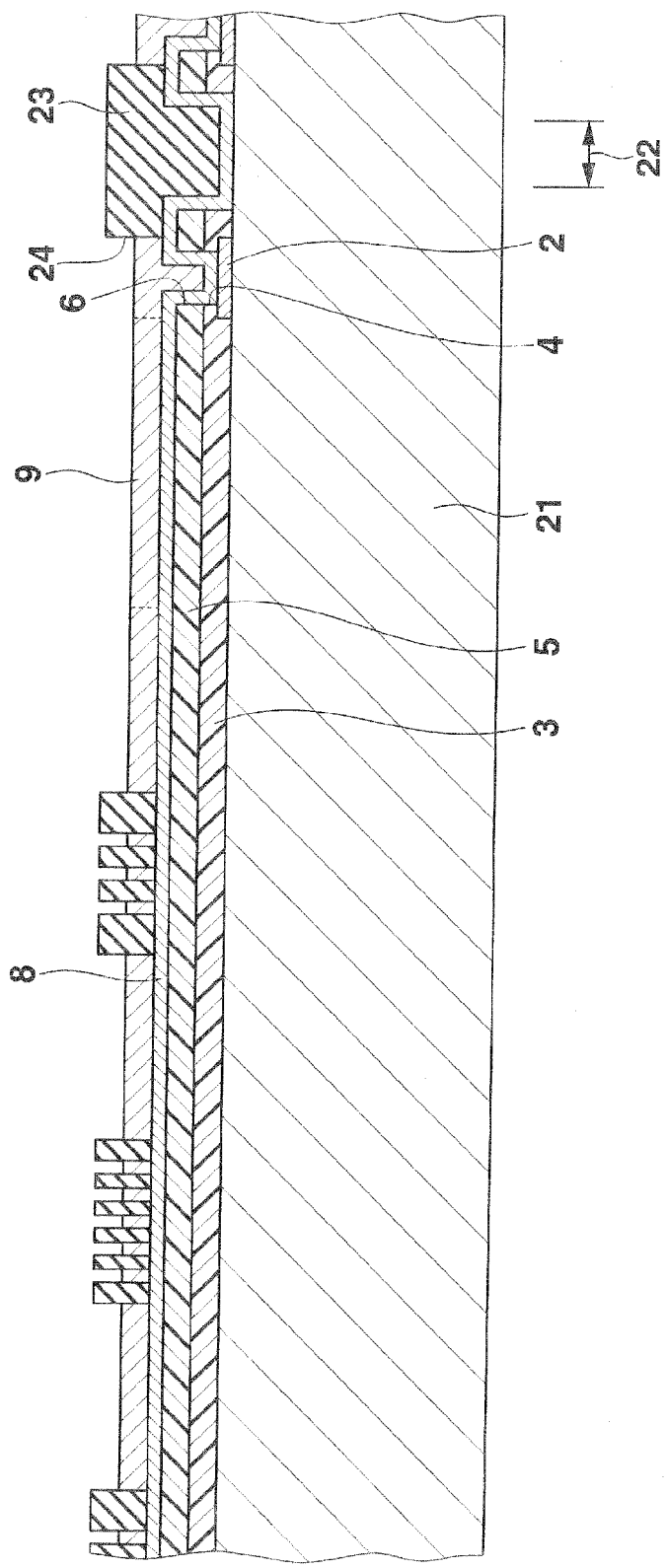
FIG. 4 is a sectional view of a step following FIG. 3.

Then, as shown in FIG. 4, a foundation metal layer 8 is formed on the upper surface of the first insulating film 5 including the upper surface of the connection pad 2 exposed through openings 4, 6 of the passivation film 3 and the first insulating film 5, and on parts of the upper surface of the semiconductor wafer 21 corresponding to the dicing street 22 and both its sides. In this case, the foundation metal layer 8 may only be a copper layer formed by electroless plating, may only be a copper layer formed by sputtering, or may be a copper layer formed by sputtering on a thin film layer of, for example, titanium formed by sputtering.

Then, a plating resist film 23 made of a positive liquid resist is patterned/formed on the upper surface of the foundation metal layer 8. In this case, an opening 24 is formed in a part of the plating resist film 23 corresponding to a region where the upper metal layer 9 is to be formed. Further, electrolytic plating with copper is carried out using the foundation metal layer 8 as a plating current path, thereby forming the upper metal layer 9 on the upper surface of the foundation metal layer 8 within the opening 24 in the plating resist film 23. Subsequently, the plating resist film 23 is released.

Figure 5:
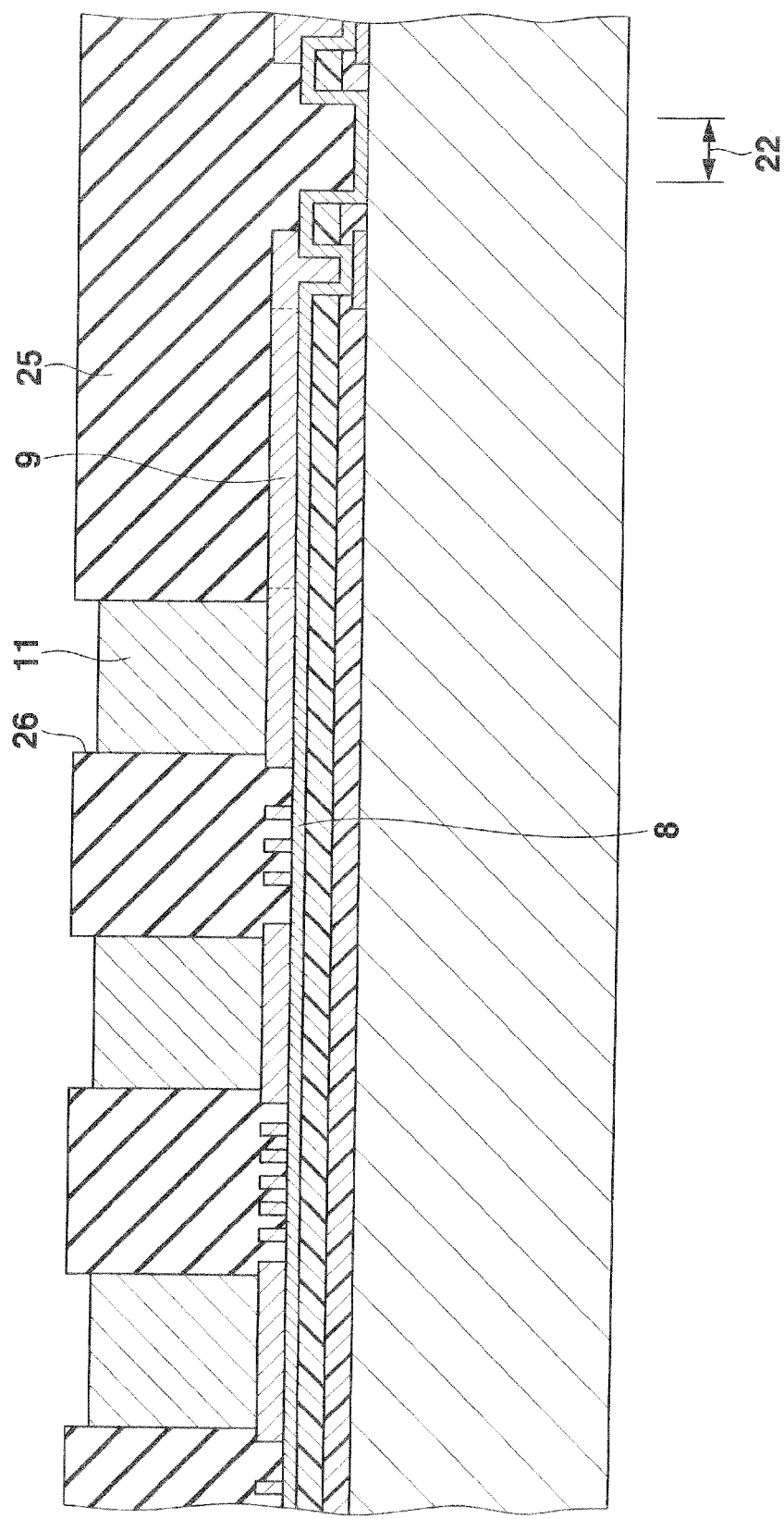
FIG. 5 is a sectional view of a step following FIG. 4.

Then, as shown in FIG. 5, a plating resist film 25 made of a negative dry film resist is patterned/formed on the upper surface of the foundation metal layer 8. In this case, an opening 26 is formed in a part of the plating resist film 25 corresponding to the connection pad portion of the upper metal layer 9 (a region where a columnar electrode 11 is to be formed). Then, electrolytic plating with copper is carried out using the foundation metal layer 8 as a plating current path. As a result, the columnar electrode 11 is formed on the upper surface of the connection pad portion of the upper metal layer 9 within the opening 26 in the plating resist film 25.

Figure 6:
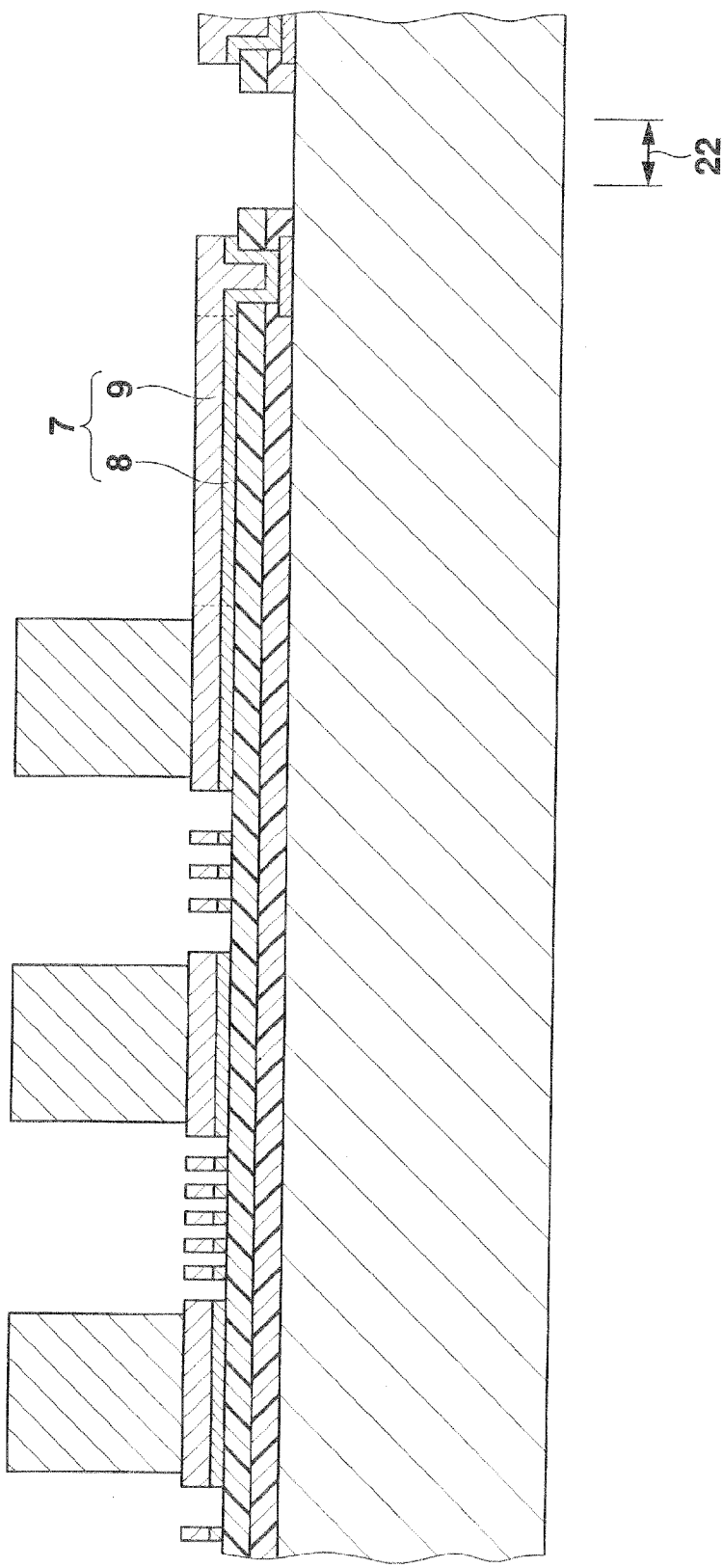
FIG. 6 is a sectional view of a step following FIG. 5.

Then, the plating resist film 25 is released. Further, using the upper metal layer 9 as a mask, the foundation metal layer 8 located in a part other than a part under the upper metal layer 9 is etched and removed. Thus, as shown in FIG. 6, the foundation metal layer 8 remains under the upper metal layer 9 alone. In this state, a wiring line 7 having a double-layer structure is formed by the upper metal layer 9 and the foundation metal layer 8 remaining thereunder.

Figure 7:
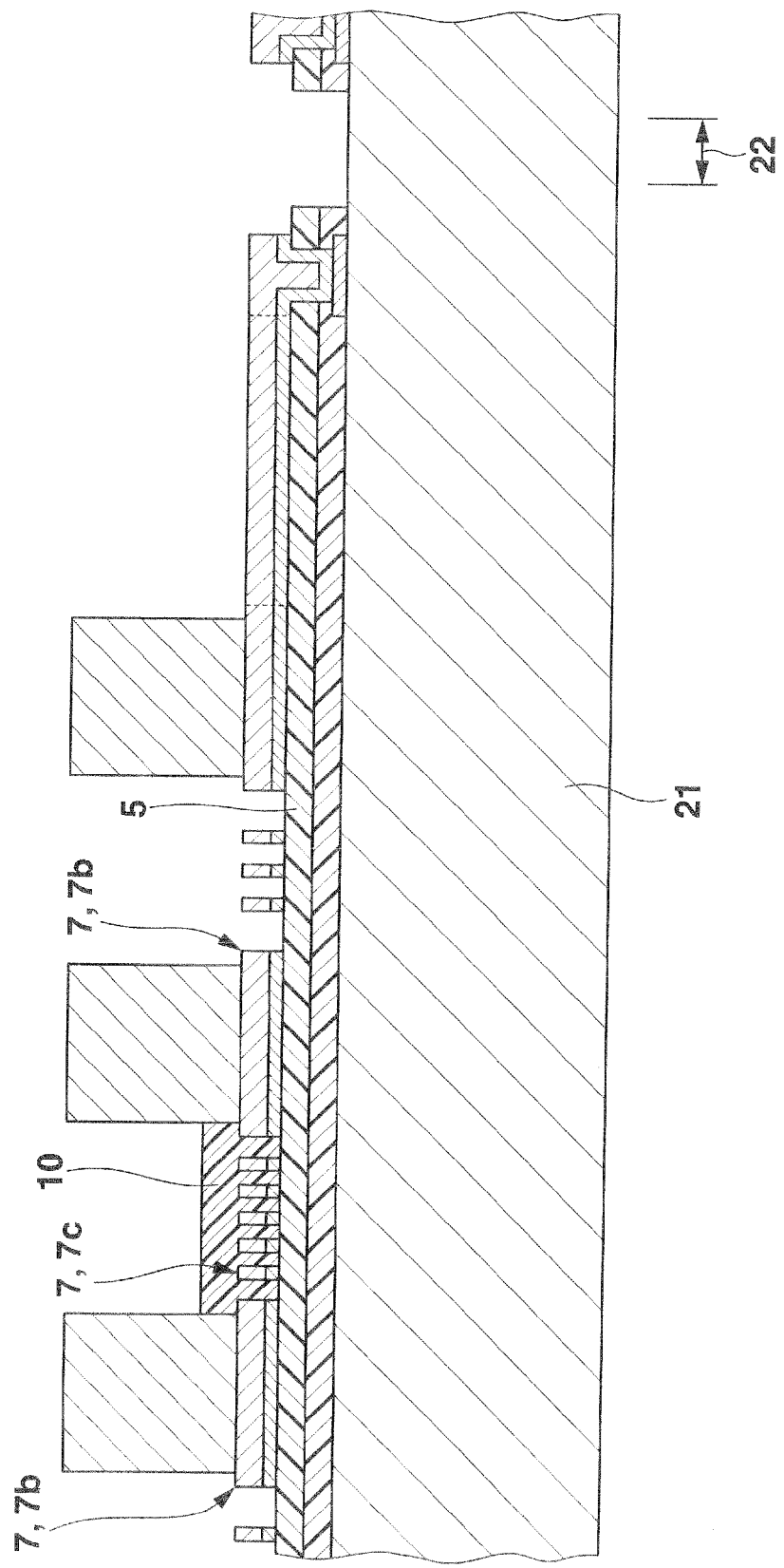
FIG. 7 is a sectional view of a step following FIG. 6.

Then, as shown in FIG. 7, a second insulating film 10 made of, for example, a polyimide resin is formed by, for example, a screen printing method or ink jet method on the upper surface of the first insulating film 5 including five extension lines 7c formed between connection pad portions 7b of adjacent two predetermined wiring lines 7 and also including the peripheral portions of the adjacent two connection pad portions 7b on both sides of the five extension lines 7c.

In this case, to explain with reference to FIG. 1, the second insulating film 10 is formed, linearly in the shape of a belt, on the upper surface of the first insulating film 5 in a part where the five extension lines 7c are parallel to one another and both sides of this part including the peripheral portions of the connection pad portions 7b. That is, a short circuit is apt to be caused by electromigration in the region where the five extension lines 7c are parallel to one another. Therefore, this region lone is covered with the belt-shaped linear second insulating film 10. This makes it possible to prevent a short circuit from being easily caused by the electromigration in the region.

The second insulating film 10 is thus formed only in the region where a short circuit is apt to be caused by the electromigration. As a result, the region where the second insulating film 10 is formed can be minimized. Consequently, even if the second insulating film 10 made of, for example, a polyimide resin cures and contracts, the semiconductor wafer 21 is not easily warped. Moreover, the subsequent steps are not easily troubled by the warping of the semiconductor wafer 21.

Figure 8:
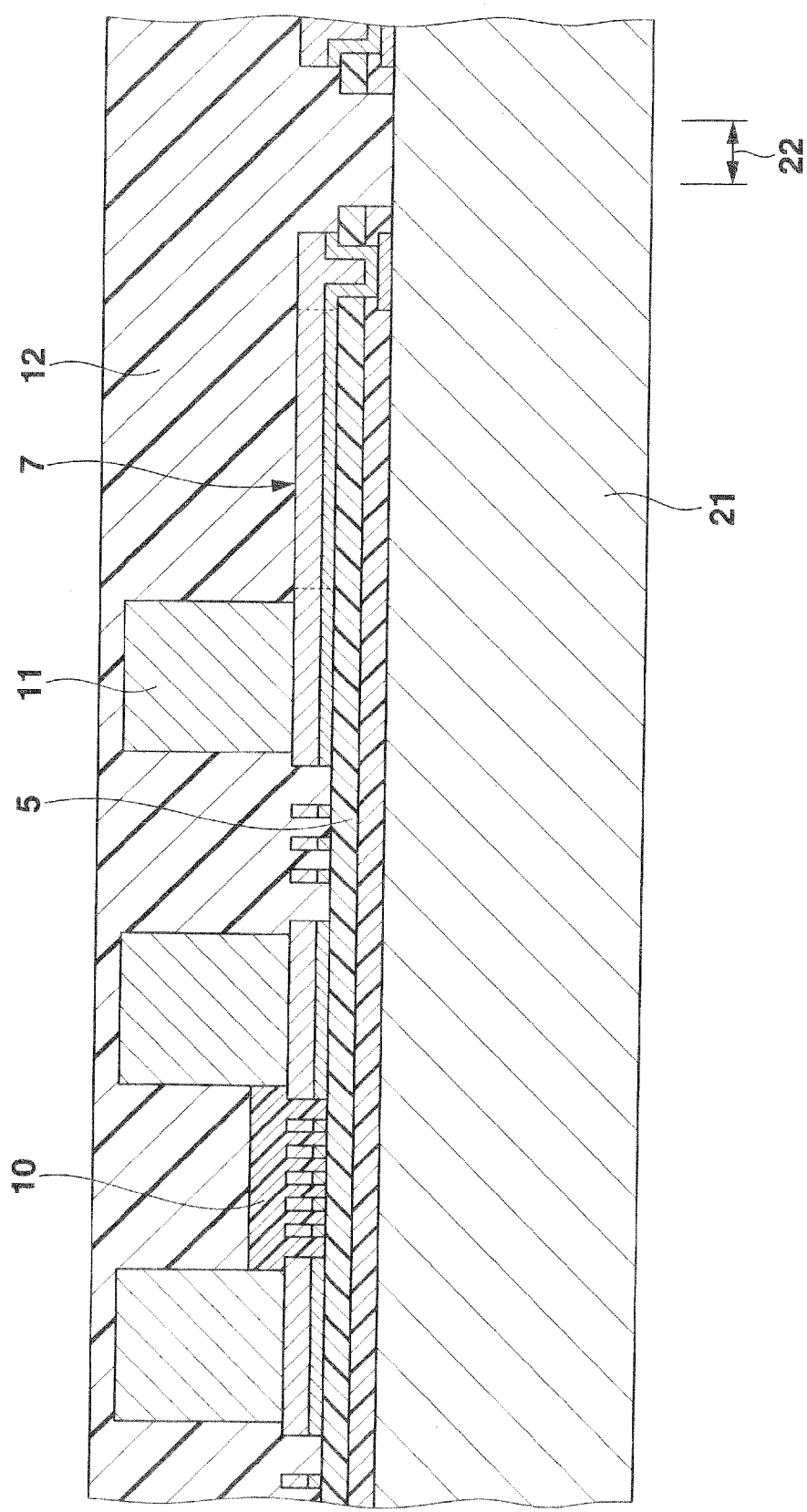
FIG. 8 is a sectional view of a step following FIG. 7.

Then, as shown in FIG. 8, a sealing film 12 made of an epoxy resin formed by, for example, a spin coat method on the upper surface of the semiconductor wafer 21 corresponding to the dicing street 22 and both its sides, on the upper surface of the first insulating film 5 including the wiring line 7 and the columnar electrode 11 and on the upper surface of the second insulating film 10 so that the thickness of this sealing film 12 is slightly greater than the height of the columnar electrode 11. Thus, in this state, the upper surface of the columnar electrode 11 is covered with the sealing film 12.

Figure 9:
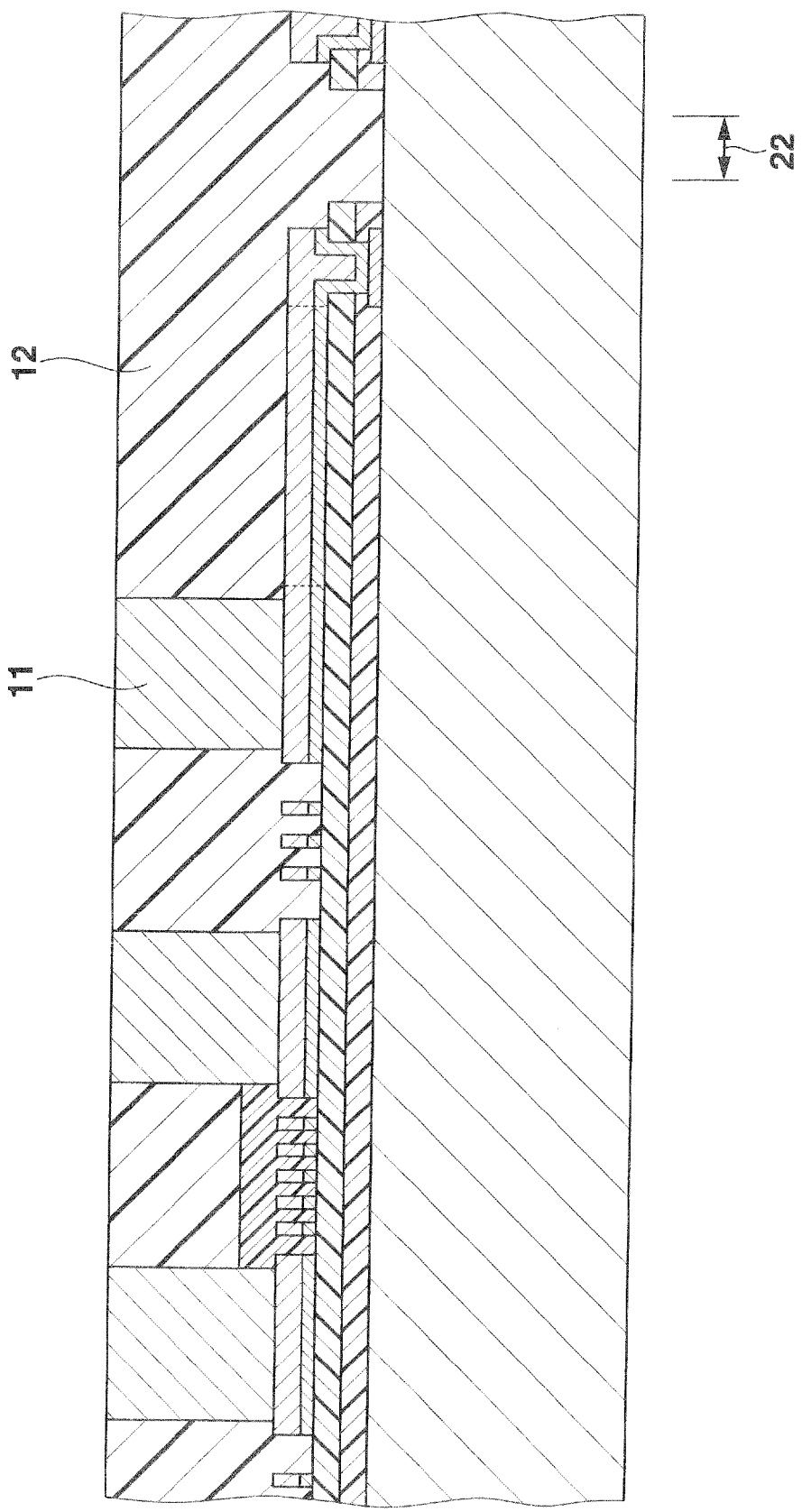
FIG. 9 is a sectional view of a step following FIG. 8;
FIG, 10 is a sectional view of a step following FIG. 9.
Figure 10:
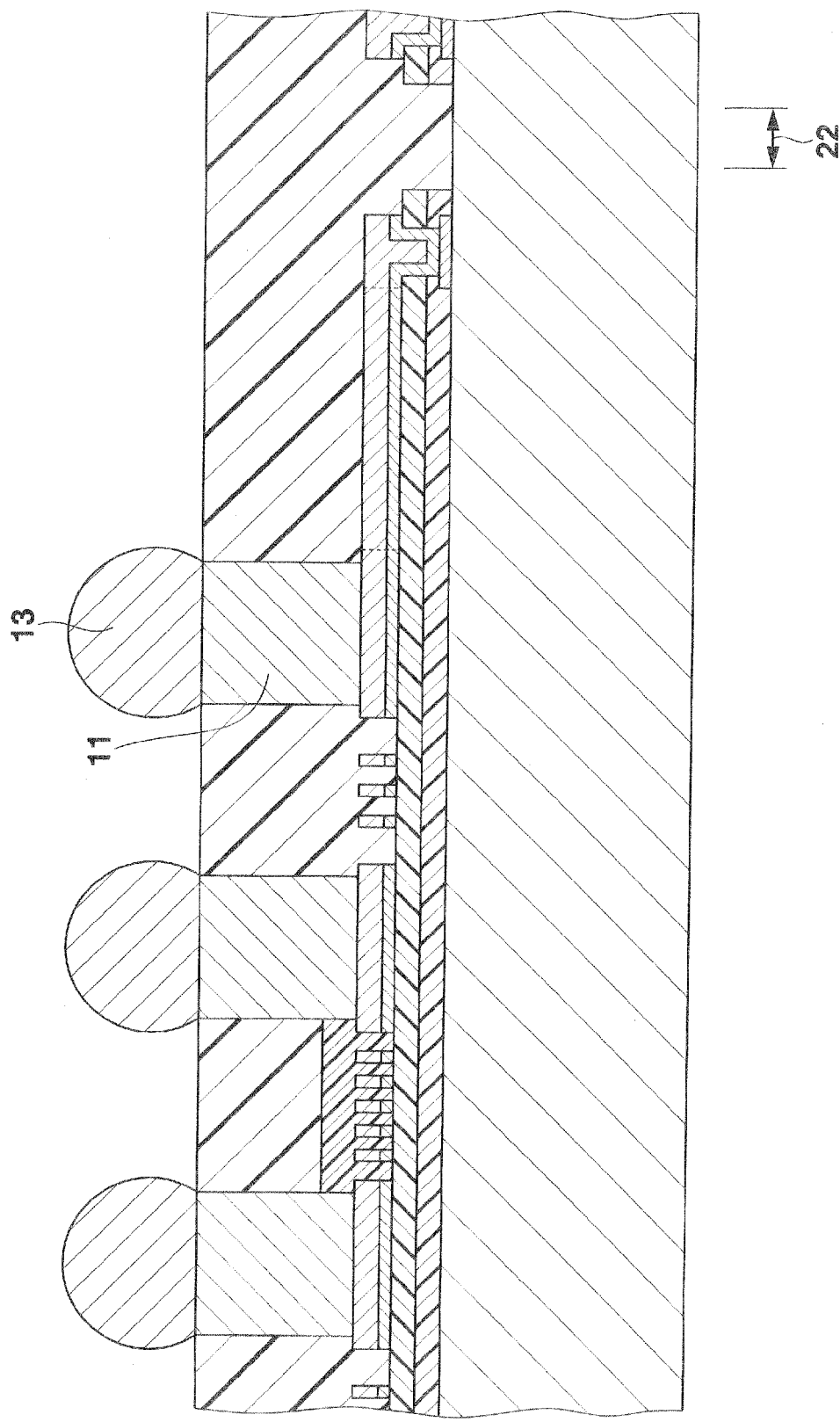
Figure 11:
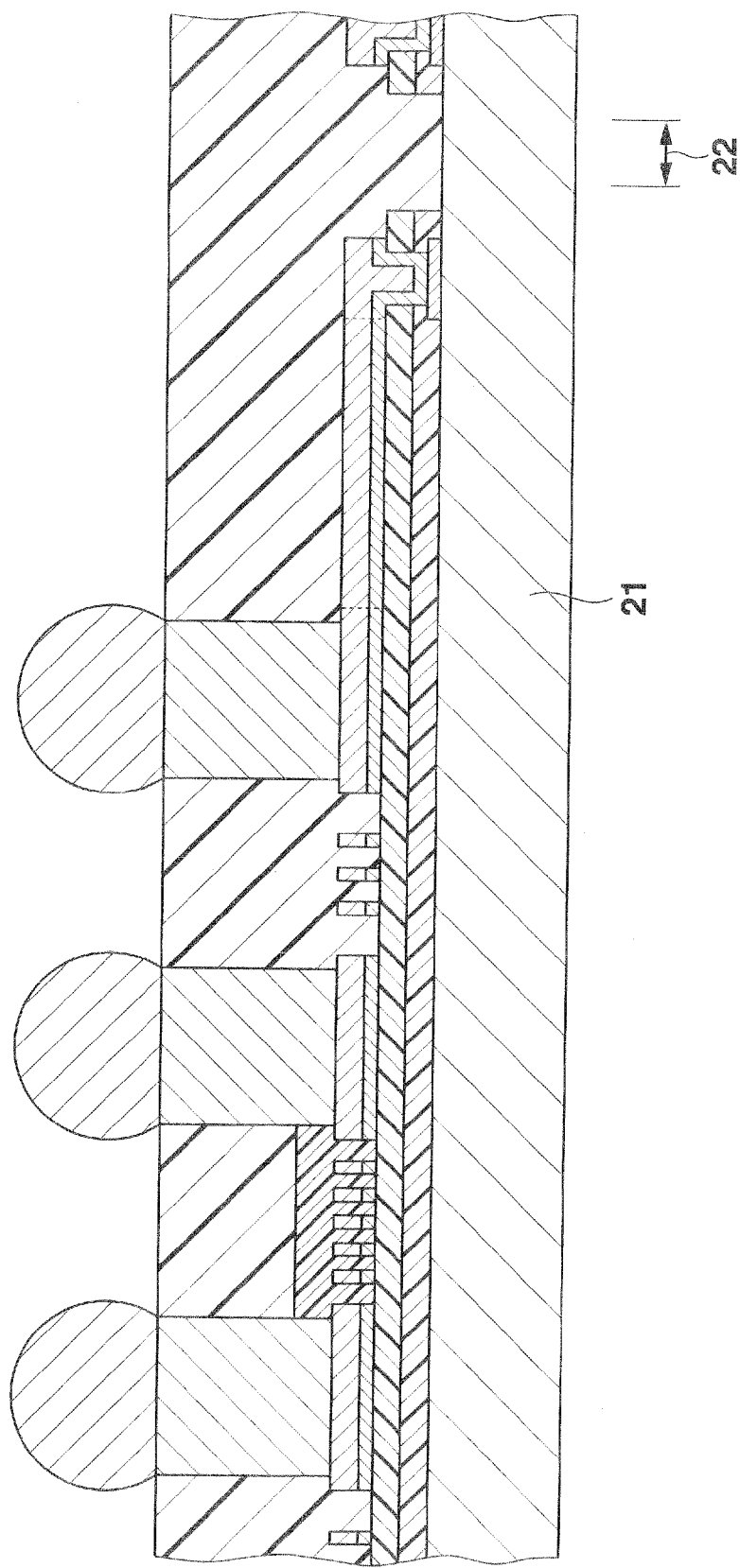
FIG. 11 is a sectional view of a step following FIG. 10.
Figure 12:
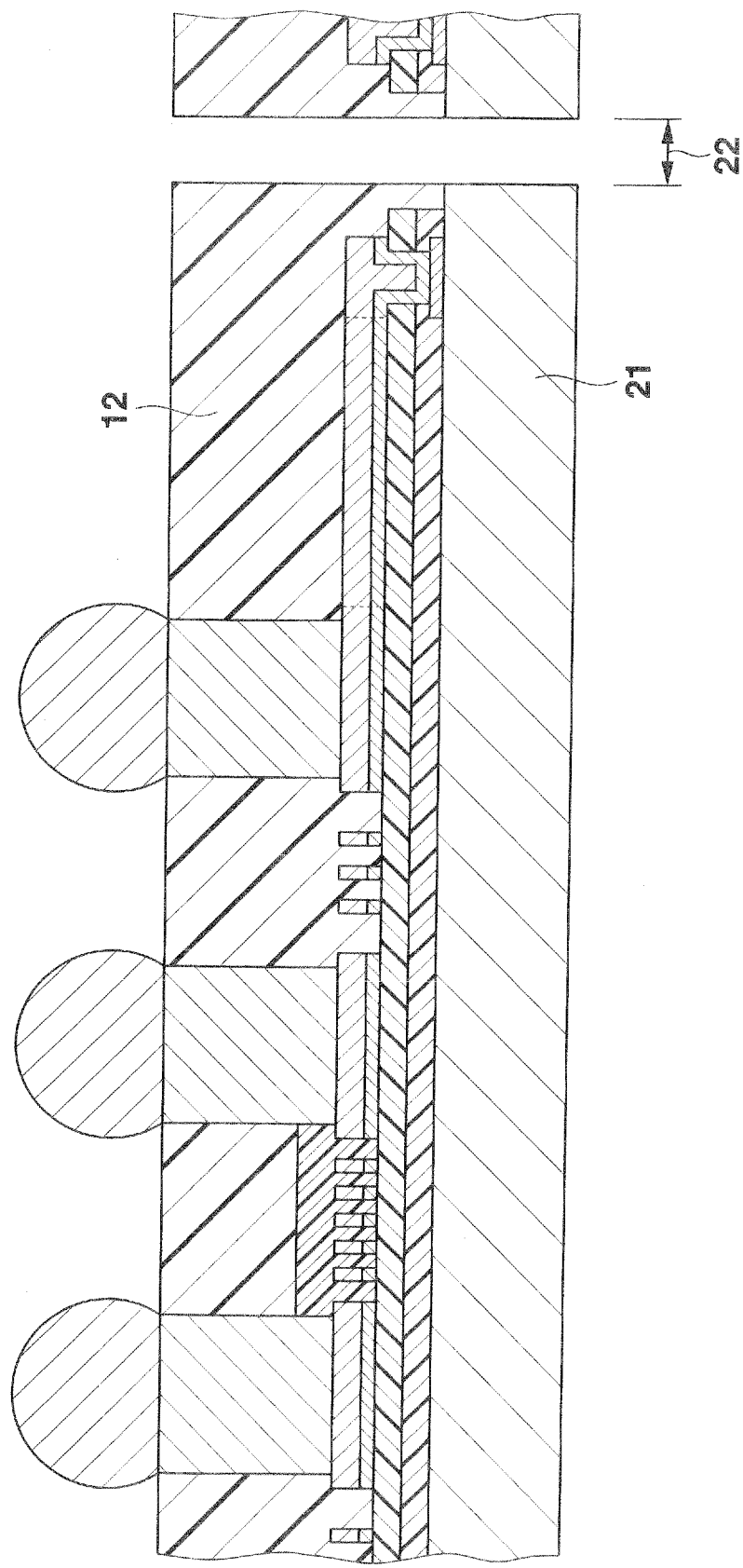
FIG. 12 is a sectional view of a step following FIG. 11.

Then, the upper side of the sealing film 12 is properly ground to expose the upper surface of the columnar electrode 11 as shown in FIG. 9, and the upper surface of the sealing film 12 including the exposed upper surface of the columnar electrode 11 is planarized. Further, as shown in FIG. 10, a solder ball 13 is formed on the upper surface of the columnar electrode 11. Then, as shown in FIG. 12, the lower side of the semiconductor wafer 21 is properly ground to reduce the thickness of the semiconductor wafer 21. Then, as shown in FIG. 12, the sealing film 12 and the semiconductor wafer 21 are cut along the dicing streets 22, thereby obtaining a plurality of semiconductor devices shown in FIG. 2.

Figure 13:
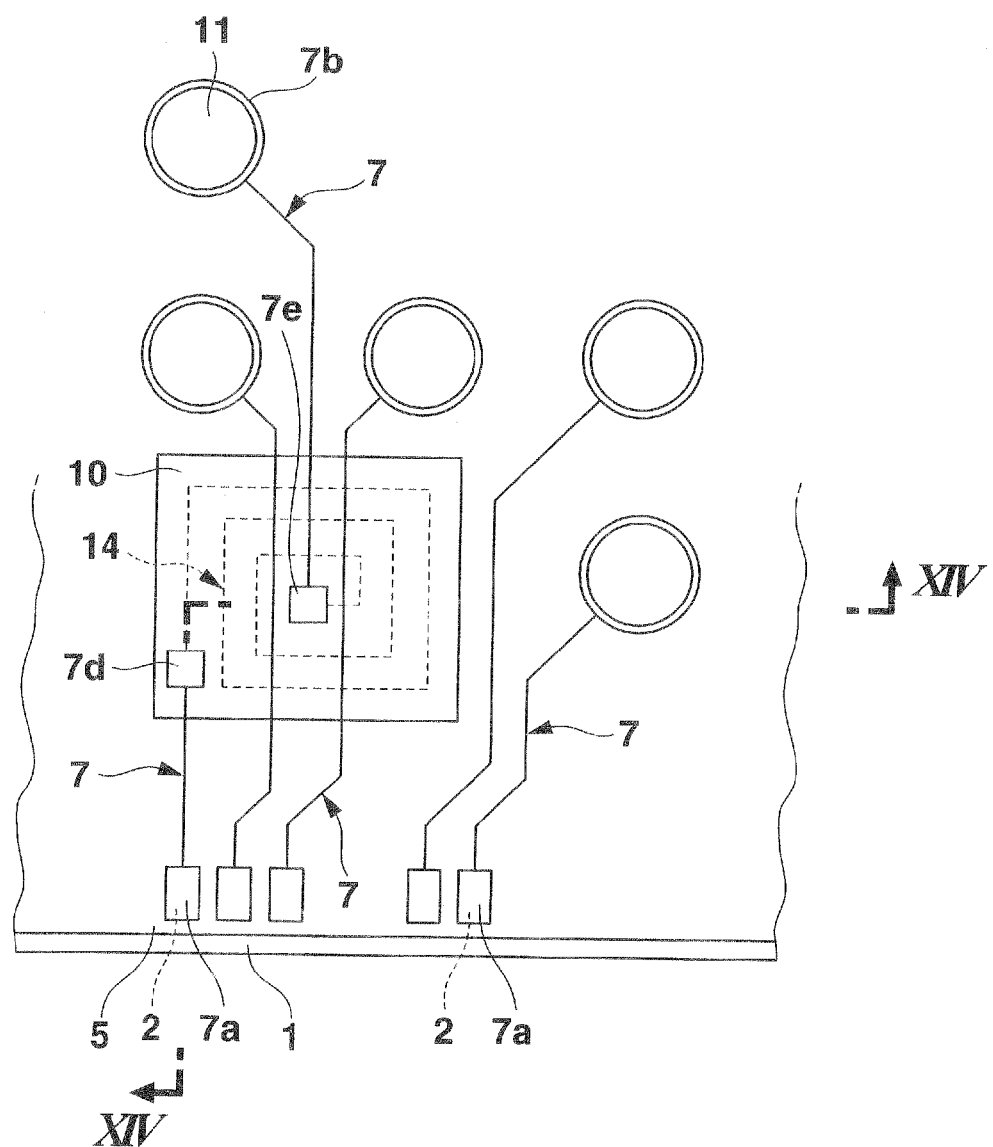
FIG. 13 is a plan view of essential parts of a semiconductor device according to a second embodiment of this invention.
Figure 14:
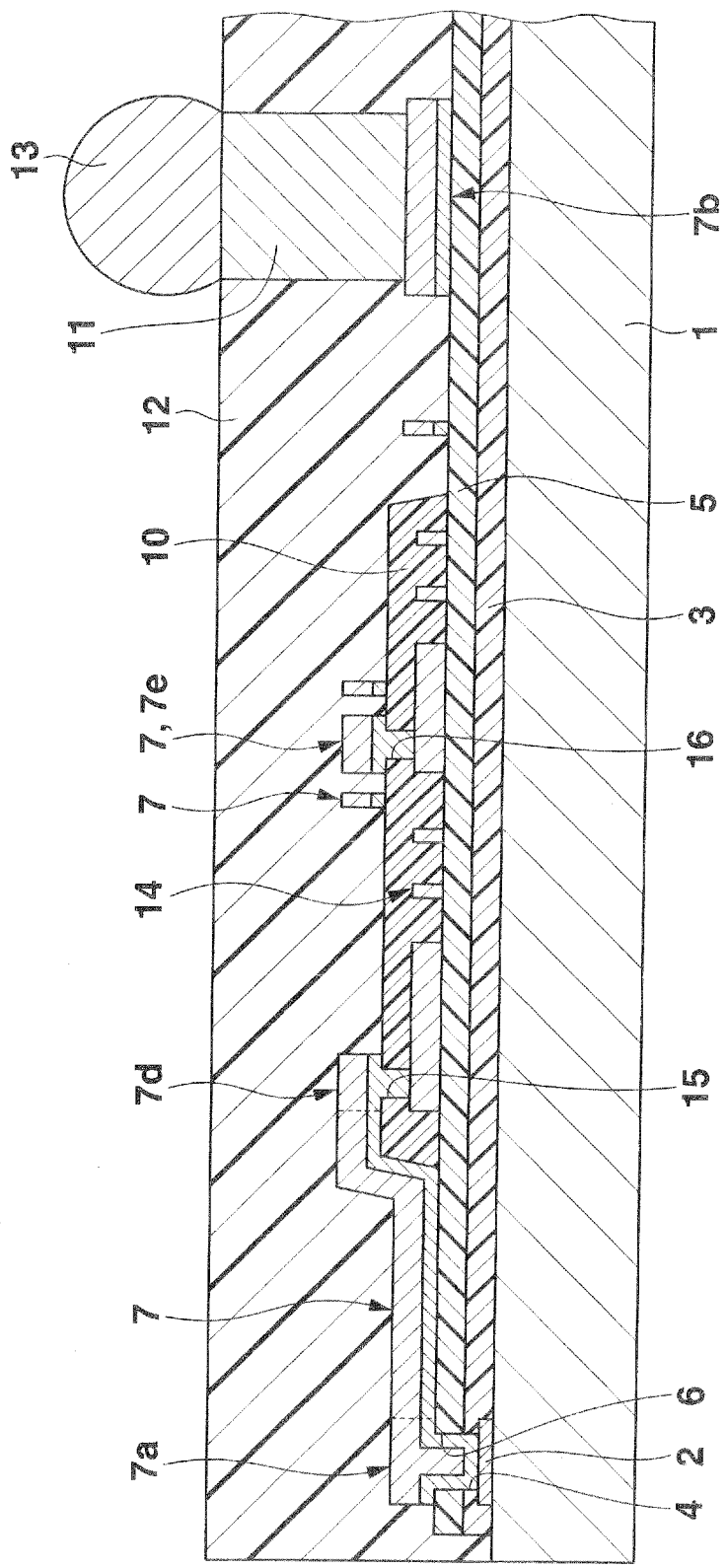
FIG. 14 is a sectional view of a portion substantially along the line XIV-XIV line of FIG. 13.

(Second Embodiment)
FIG. 13 shows a plan view of essential parts of a semiconductor device according to a second embodiment of this invention. FIG. 14 shows a sectional view of a portion substantially along the line XIV-XIV line of FIG. 13. In this case as well, a sealing film 12 and a solder ball 13 that are shown in FIG. 14 are omitted in the plan view of FIG. 13. In this semiconductor device, a spiral thin film inductive element (lower wiring line) 14 made of, for example, copper is provided on the upper surface of a first insulating film 5.

A second insulating film 10 is provided on the entire thin film inductive element 14 and its vicinity on the upper surface of the first insulating film 5. Openings 15, 16 are provided in parts of the second insulating film 10 corresponding to the outer end and inner end of the thin film inductive element 14. A plurality of wiring lines 7 are provided on the upper surfaces of the first and second insulating films 5, 10. In this case, part of the wiring line 7 provided on the upper surface of the second insulating film 10 intersects with the thin film inductive element 14. However, no short circuit is caused because the second insulating film 10 is present in between.

One end 7d of one predetermined wiring line 7 is connected to the outer end of the thin film inductive element 14 via the opening 15 of the second insulating film 10. The other end 7a of this predetermined wiring line 7 is connected to one predetermined connection pad 2. One end 7e of another predetermined wiring line 7 is connected to the inner end of the thin film inductive element 14 via the opening 16 of the second insulating film 10. The other end of this predetermined wiring line 7 is a connection pad portion 7b.

A columnar electrode 11 is provided on the upper surface of the connection pad portion 7b of the wiring line 7. The sealing film 12 is provided around the columnar electrode 11 on the upper surface of the peripheral portion of a silicon substrate 1 and on the upper surfaces of the first and second insulating films 5, 10 including the wiring lines 7. The solder ball 13 is provided on the upper surface of the columnar electrode 11.

Figure 15:
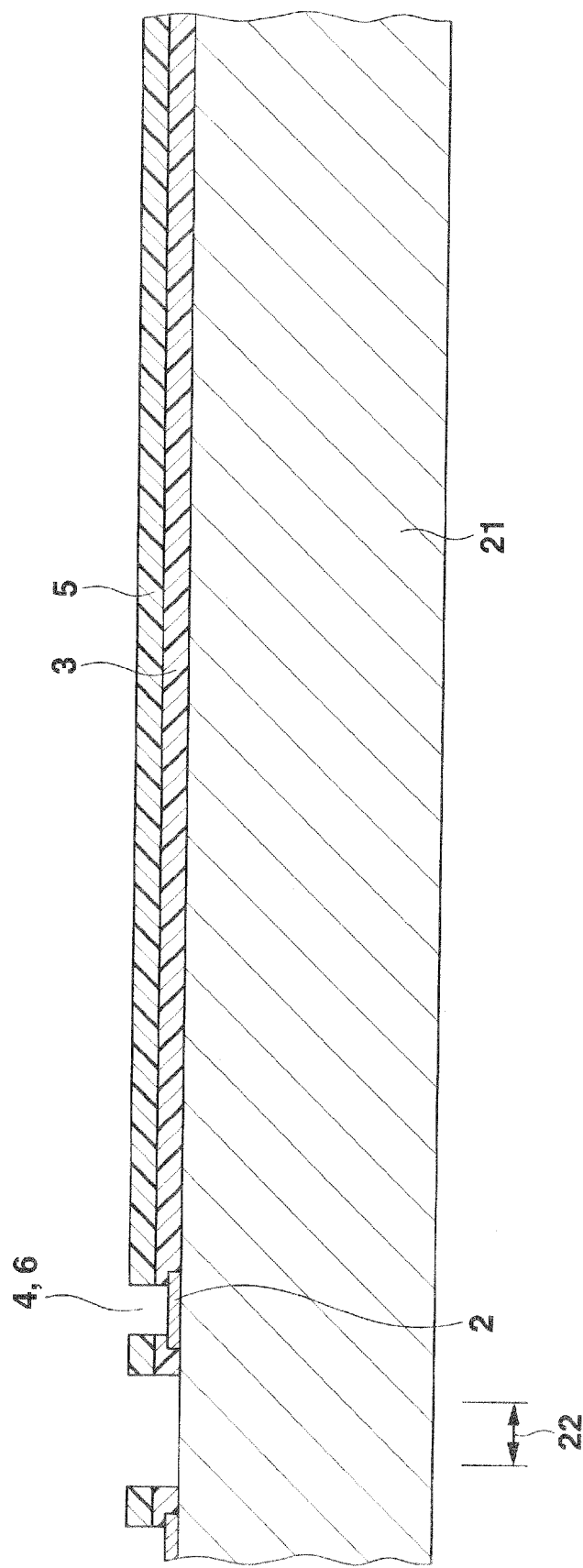
FIG. 15 is a sectional view of an initially prepared assembly in one example of a method of manufacturing the semiconductor device shown in FIG. 13 and FIG. 14.

Now, one example of a method of manufacturing this semiconductor device is described. First, as shown in FIG. 15, an assembly is prepared. In this assembly, a plurality of connection pads 2 made of, for example, an aluminum-based metal, a passivation film 3 made of, for example, silicon oxide, and a first insulating film 5 made of, for example, a polyimide resin are formed on the upper surface of a silicon substrate in a wafer state (hereinafter referred to as a semiconductor wafer 21). The centers of the connection pads 2 are exposed through openings 4, 6 of the passivation film 3 and the first insulating film 5.

In this case as well, the thickness of the semiconductor wafer 21 is greater than the thickness of a silicon substrate 1 shown in FIG. 14. In FIG. 15, zones indicated by the sign 22 are dicing streets. The parts of the passivation film 3 and the first insulating film 5 corresponding to the dicing street 22 and both its sides are removed.

Figure 16:
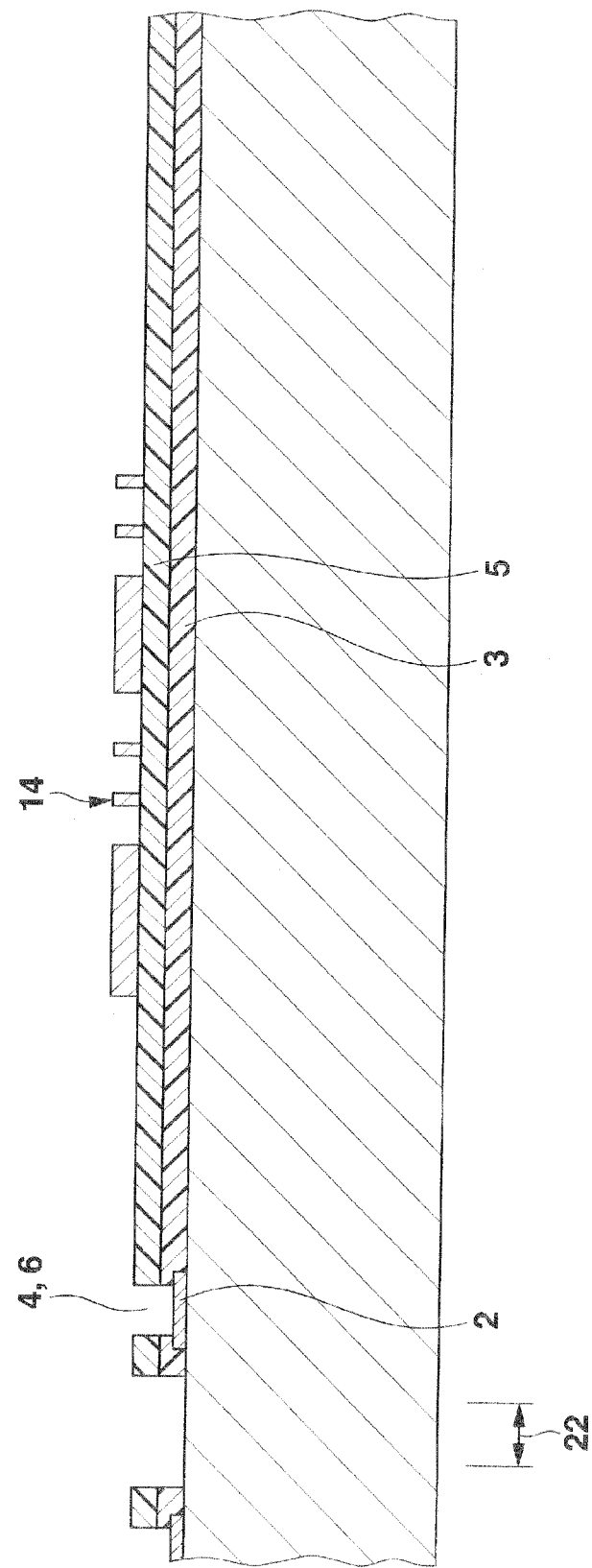
FIG. 16 is a sectional view of a step following FIG. 15.

Then, as shown in FIG. 16, a metal film of, for example, copper formed by a method such as a sputtering method is patterned on the upper surface of the first insulating film 5 by a photolithographic method, thereby forming a spiral thin film inductive element 14. Here, in the situation in which the thin film inductive element 14 is formed, the connection pads 2 are exposed through openings 4, 5 of the passivation film 3 and the first protective film 5. Therefore, the thin film inductive element 14 is made of a material different from that of the connection pads 2 so that the connection pads 2 may not be etched by the photolithographic method for forming the thin film inductive element 14.

Figure 17:
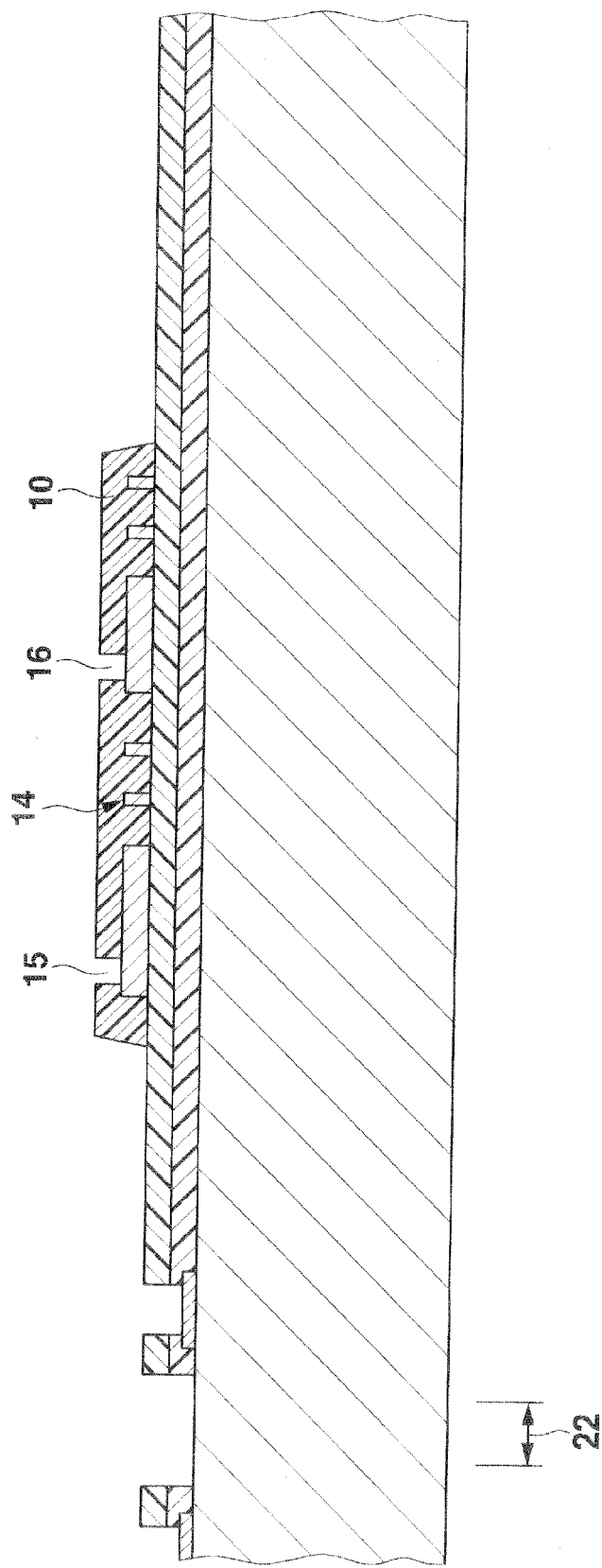
FIG. 17 is a sectional view of a step following FIG. 16.

Then, as shown in FIG. 17, a second insulating film 10 made of, for example, a polyimide resin is formed by, for example, the screen printing method or ink jet method on the upper surface of the thin film inductive element 14 and its vicinity on the upper surface of the first insulating film 5. In this state, openings 15, 16 are formed in parts of the second insulating film 10 corresponding to the outer end and inner end of the thin film inductive element 14.

In this case, the second insulating film 10 is only formed on the upper surface of the thin film inductive element 14 and its vicinity on the upper surface of the first insulating film 5. As a result, the region where the second insulating film 10 is formed can be minimized. Consequently, even if the second insulating film 10 made of, for example, a polyimide resin cures and contracts, the semiconductor wafer 21 is not easily warped. Moreover, the subsequent steps are not easily troubled by the warping of the semiconductor wafer 21.

Furthermore, as in the example of the manufacturing method according to the first embodiment, a plurality of semiconductor devices shown in FIG. 14 are obtained after a step of forming a wiring line 7 and a columnar electrode 11, a step of forming a sealing film 12, a step of forming a solder ball 13, a step of grinding the semiconductor wafer 21, and a step of dicing.

(Third Embodiment)

Figure 18:
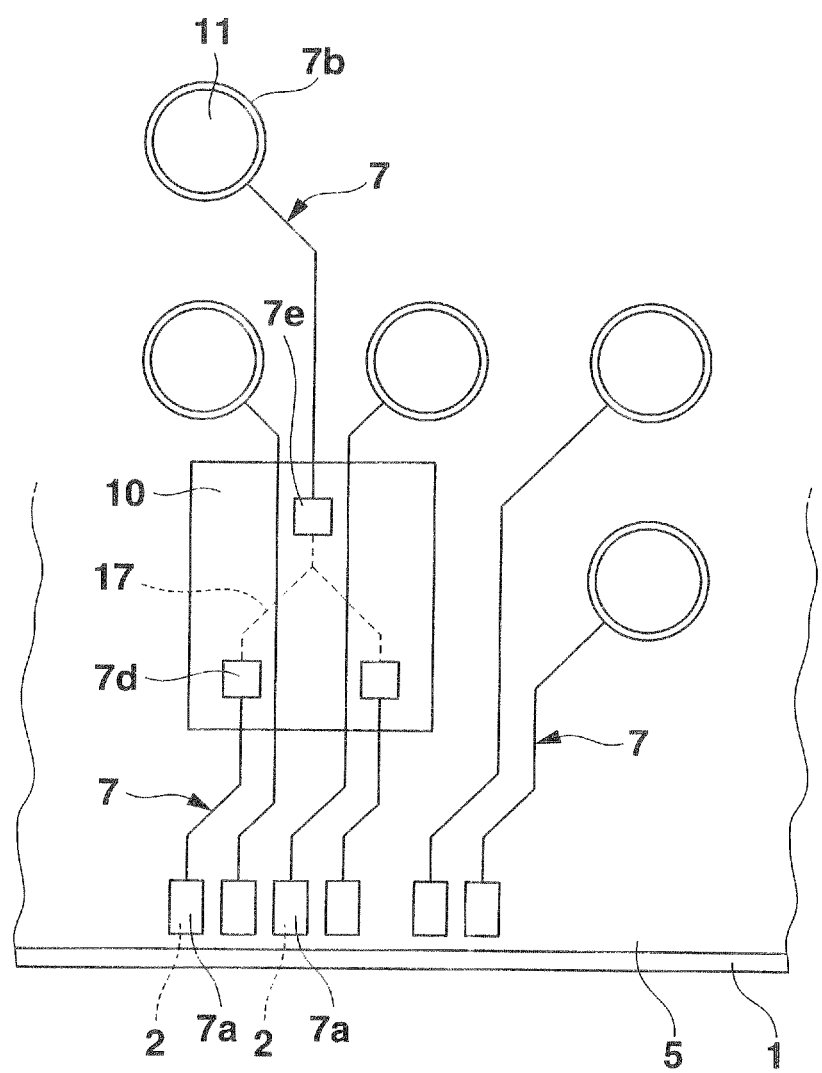
FIG. 18 is a plan view of essential parts of a semiconductor device according to a third embodiment of this invention.

FIG. 18 shows a plan view of essential parts of a semiconductor device according to a third embodiment this invention. In this semiconductor device, a substantially Y-shaped lower wiring line 17 is provided on the upper surface of a first insulating film 5. A second insulating film 10 is provided on the entire lower wiring line 17 and its vicinity on the upper surface of the first insulating film 5. Openings (not shown) are provided in parts of the second insulating film 10 corresponding to three ends of the lower wiring line 17.

A plurality of wiring lines 7 are provided on the upper surfaces of the first and second insulating films 5, 10. In this case, part of the wiring line 7 provided on the upper surface of the second insulating film 10 intersects the lower wiring line 17. However, no short circuit caused because the second insulating film 10 is present in between.

Ends 7d of two predetermined wiring lines 7 are connected to two ends of the lower wiring line 17 on one side via the openings of the second insulating film 10. The other ends 7a of the two predetermined wiring lines 7 are connected to two predetermined connection pads 2. An end 7e of another predetermined wiring line 7 is connected to an end of the lower wiring line 17 on the other side via the opening of the second insulating film 10. The other end of this predetermined wiring line 7 is a connection pad portion 7b.

In this semiconductor device manufacturing method as well, the second insulating film 10 is formed by, for example, the screen printing method or ink jet method. In this case, the second insulating film 10 has only to be formed on the upper surface of the lower wiring line 17 and its vicinity on the upper surface of the first insulating film 5. As a result, the region where the second insulating film 10 is formed can be minimized. Consequently, even if the second insulating film 10 made of, for example, a polyimide resin cures and contracts, the semiconductor wafer 21 is not easily warped. Moreover, the subsequent steps are not easily troubled by the warping of the semiconductor wafer 21.

In the case described above, the lower wiring line 17 is substantially Y-shaped, that is, the lower wiring line 17 has one end on one side, and two ends on the other side which are both connected to the one end on the one side. The present invention is not limited to this. The lower wiring line 17 may have one end on one side, and three or more ends on the other side which are all connected to the end on the one side.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a semiconductor substrate;
a first insulating film provided on the semiconductor substrate;
a lower wiring line provided on the first insulating film;
a second insulating film provided on a part of the first insulating film including the entire lower wiring line; and
a plurality of wiring lines provided on the first insulating film and the second insulating film,
wherein the lower wiring line is configured by a spiral thin film inductive element, and an end of one of the wiring lines and an end of another of the wiring lines are connected to an outer end and an inner end of the thin film inductive element via openings provided in the second insulating film, respectively.

2. The semiconductor device according to claim 1, wherein:
a columnar electrode is provided on a connection pad portion of at least one of the wiring lines, and
a sealing film is provided around the columnar electrode.

3. The semiconductor device according to claim 1, wherein the second insulating film is made of a polyimide resin.

4. A semiconductor device comprising:
a first insulating film;
a plurality of wiring lines provided on the first insulating film, each of the wiring lines including a connection pad portion and an extension line; and
a second insulating film provided on a part of the first insulating film including the wiring lines, wherein at least a part in which a distance between the extension lines arranged between adjacent connection pad portions is smallest is covered with the second insulating film, which is belt-shaped and linear when viewed from above.

5. The semiconductor device according to claim 4, wherein:
the first insulating film is provided on a semiconductor substrate, and
the connection pad portions are arranged in matrix form, and the extension lines of the wiring lines including the connection pad portions that are disposed on an inner side extend parallel to one another between the connection pad portions of two adjacent wiring lines that are disposed on an outermost peripheral side.

6. A semiconductor device comprising:
a semiconductor substrate;
a first insulating film provided on the semiconductor substrate;
a lower wiring line provided on the first insulating film;
a second insulating film provided on a part of the first insulating film including the entire lower wiring line; and
a plurality of wiring lines provided on the first insulating film and the second insulating film,
wherein the lower wiring line includes one end on a first side and a plurality of ends on a second side which are all are connected to the end on the first side, and
wherein an end of one of the wiring lines and ends of others of the wiring lines are connected to the one end on the first side and the ends on the second side of the lower wiring line via openings provided in the second insulating film, respectively.

7. The semiconductor device according to claim 6, wherein at least one of the wiring lines provided on the second insulating film is disposed to intersect with the lower wiring line.

8. A manufacturing method of a semiconductor device comprising:
forming a first insulating film on a semiconductor wafer;
forming a lower wiring line on the first insulating film;
forming a second insulating film on a part of the first insulating film including the entire lower wiring line;
forming a plurality of wiring lines on the first insulating film and the second insulating film; and
cutting at least the semiconductor to obtain a plurality of semiconductor devices,
wherein the lower wiring line is configured by a spiral thin film inductive element, and an end of one of the wiring lines and an end of another of the wiring lines are connected to an outer end and an inner end of the thin film inductive element via openings formed in the second insulating film, respectively.

9. The method according to claim 8, wherein the second insulating film is formed by a polyimide resin.

10. The method according to claim 8, wherein the second insulating film is formed by an ink jet method or a screen printing method.

11. The method according to claim 10, further comprising:
forming a columnar electrode on a connection pad portion of at least one of the wiring lines; and
forming a sealing film around the columnar electrode.

* * * * *